United States Patent
Tokumitsu et al.

(10) Patent No.: US 7,532,085 B2
(45) Date of Patent: May 12, 2009

(54) ELECTRONIC DEVICE

(75) Inventors: Tsuneo Tokumitsu, Yamanashi (JP); Hideki Tango, Yamanashi (JP); Osamu Anegawa, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 62 days.

(21) Appl. No.: 11/806,331

(22) Filed: May 31, 2007

(65) Prior Publication Data

US 2007/0279823 A1 Dec. 6, 2007

(30) Foreign Application Priority Data

May 31, 2006 (JP) ............... 2006-152894

(51) Int. Cl.
H03H 7/38 (2006.01)
(52) U.S. Cl. ........................ 333/33; 333/260
(58) Field of Classification Search ............. 333/32–35, 333/260
See application file for complete search history.

(56) References Cited

U.S. PATENT DOCUMENTS

| | | |
|---|---|---|
| 4,611,186 A | 9/1986 | Ziegner |
| 5,583,468 A | 12/1996 | Kielmeyer et al. |
| 6,100,775 A | 8/2000 | Wen |
| 6,241,143 B1 | 6/2001 | Kuroda |
| 2005/0174190 A1* | 8/2005 | Yagyu et al. ............ 333/33 |
| 2006/0158280 A1* | 7/2006 | Jow et al. .............. 333/33 |
| 2007/0126524 A1* | 6/2007 | Yagisawa ............... 333/33 |

FOREIGN PATENT DOCUMENTS

| | | |
|---|---|---|
| EP | 1 363 350 A1 | 11/2003 |
| JP | 3-089605 A | 4/1991 |
| JP | 09-148524 A | 6/1997 |
| JP | 09-223906 A | 8/1997 |
| JP | 10-256801 A | 9/1998 |
| JP | 2000-91818 A | 3/2000 |
| JP | 2000-151223 A | 5/2000 |
| JP | 2004-259769 A | 9/2004 |

OTHER PUBLICATIONS

Japanese Notification of Reason(s) for Refusal dated Apr. 15, 2008, issued in corresponding Japanese Patent Application No. 2006-152894.

European Search Report dated Sep. 17, 2007, issued in corresponding European Patent Application No. 07 10 9136.

Japanese Notification for Reason(s) of Refusal dated Sep. 16, 2008 issued in corresponding Japanese Patent Application No. 2006-152894.

* cited by examiner

*Primary Examiner*—Don P Le
(74) *Attorney, Agent, or Firm*—Westerman, Hattori, Daniels & Adrian, LLP.

(57) ABSTRACT

An electronic device includes a first transmission line, a second transmission line and a ground-coupling portion. The first transmission line is composed of a first signal line transmitting a given high frequency wave signal and a first ground. The second transmission line is composed of a second signal line transmitting the high frequency wave signal and a second ground. The ground-coupling portion couples the first ground and the second ground. A phase difference between the high frequency wave signals at both ends of the ground-coupling portion is substantially integral multiple of 180 degrees.

5 Claims, 8 Drawing Sheets

ELECTRONIC DEVICE

BACKGROUND OF THE INVENTION

1. Field of the Invention

This invention generally relates to an electronic device, and in particular, relates to an electronic device having two transmission lines.

2. Description of the Related Art

A micro strip line, a coplanar line and so on are used as a transmission line for high frequency wave such as a micro wave, a milliwave and so on, the micro strip line having a dielectric layer provided between a signal line and a ground, the coplanar line having a signal line and having grounds provided on both sides of the signal line.

Japanese Patent Application Publication No. 10-256801 discloses a case where two micro strip lines are coupled. A description will be given of a conventional embodiment, with reference to FIG. 1A and FIG. 1B. FIG. 1A illustrates a top view of the conventional embodiment. FIG. 1B illustrates a cross sectional view taken along a line B-B of FIG. 1A. As shown in FIG. 1A and FIG. 1B, a first micro strip line 10 and a second micro strip line 20 are coupled to each other. The first micro strip line 10 has a structure in which a first ground layer 16 is provided on a back face of a first dielectric layer 14 and a first signal line 12 is provided on a front face of the first dielectric layer 14. The second micro strip line 20 has a structure in which a second ground layer 26 is provided on a back face of a second dielectric layer 24 and a second signal line 22 is provided on a front face of the second dielectric layer 24.

The first ground layer 16 and the second ground layer 26 are arranged on a metal substrate 50 composed of a conductive material such as copper and are fixed to the metal substrate 50 so as to be electrically coupled to each other. The first signal line 12 and the second signal line 22 are coupled to each other through a bonding wire 30a. Thus, the first ground layer 16 and the second ground layer 26 are electrically coupled to each other without a generation of parasitic inductance. Therefore, an electrical potential of the first ground layer 16 is equal to that of the second ground layer 26 from a view point of DC and high frequency wave.

However, in a case where the first ground layer 16 and the second ground layer 26 cannot be arranged on the metal substrate 50 as a case of the conventional embodiment, the parasitic inductance is added when the first ground layer 16 and the second ground layer 26 are coupled to each other through a bonding wire and so on. The parasitic inductance is not negligible even if the length of the bonding wire is reduced, when the frequency of a high frequency wave is higher. That is, the electrical potential of the first ground layer 16 is different from that of the second ground layer 26 and it is difficult to match impedances of two micro strip lines. Therefore, a loss is increased. And a mismatch is generated between the impedances, because the first signal line 12 and the second signal line 22 are coupled to each other through the bonding wire 30a.

SUMMARY OF THE INVENTION

The present invention provides an electronic device, in which two transmission lines are coupled to each other and electrical potentials of grounds of the transmission lines are substantially equal to each other, that can limit a loss between transmission lines.

According to an aspect of the present invention, preferably, there is provided an electronic device including a first transmission line, a second transmission line and a ground-coupling portion. The first transmission line is composed of a first signal line transmitting a given high frequency wave signal and a first ground. The second transmission line is composed of a second signal line transmitting the high frequency wave signal and a second ground. The ground-coupling portion couples the first ground and the second ground. A phase difference between the high frequency wave signals at both ends of the ground-coupling portion is substantially integral multiple of 180 degrees.

With the above-mentioned configuration, an electrical potential of the first ground is equal to that of the second ground. It is therefore possible to limit a loss between the two transmission lines.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

Figure 1A:
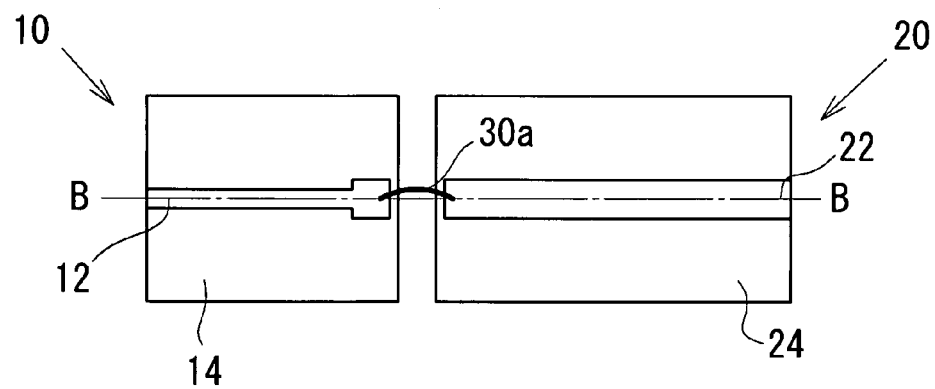
FIG. 1A illustrates a top view of a conventional embodiment and FIG. 1B illustrates a cross sectional view taken along a line B-B of FIG. 1A.
Figure 1B:
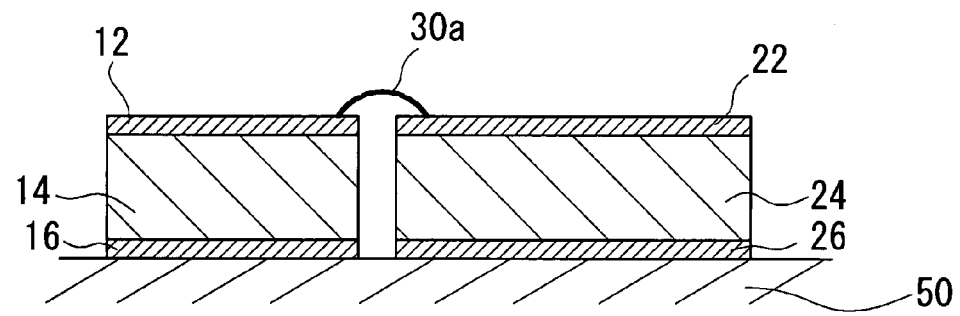
Figure 2A:
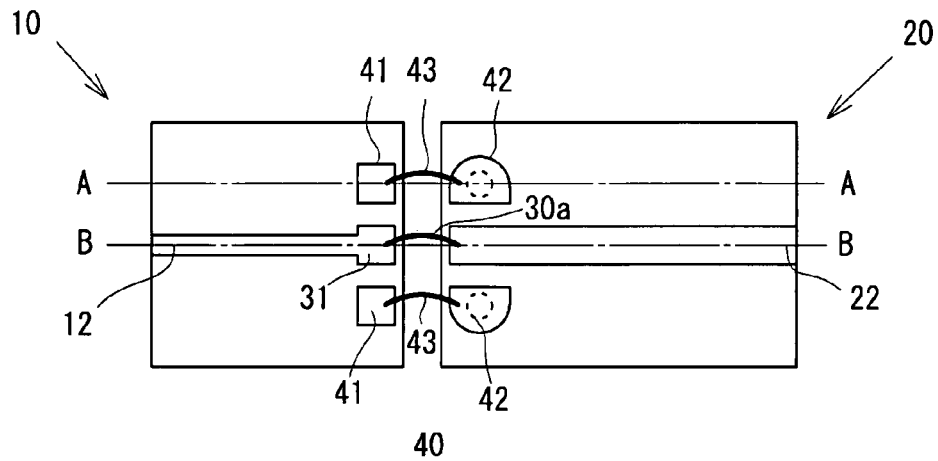
FIG. 2A illustrates a top view of a comparative embodiment.
Figure 2B:
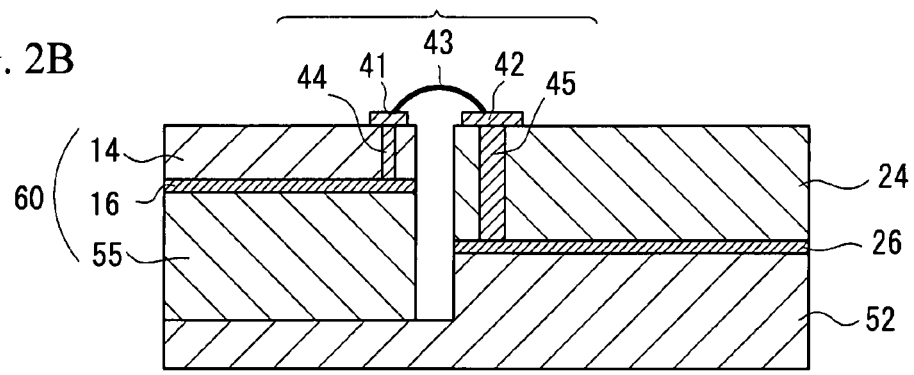
FIG. 2B illustrates a cross sectional view taken along a line A-A of FIG. 2A.
Figure 2C:
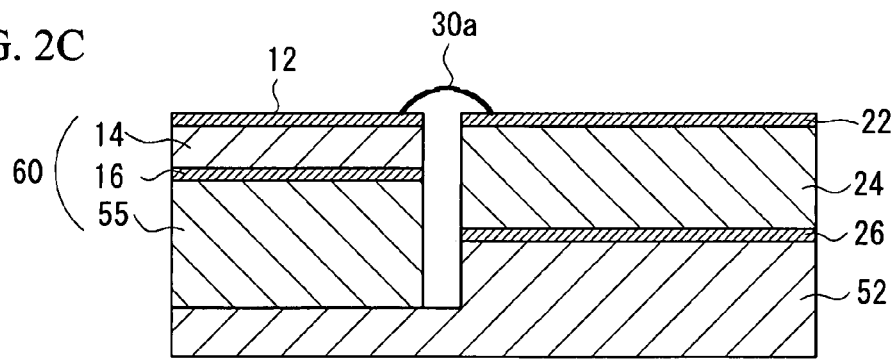
FIG. 2C illustrates a cross sectional view taken along a line B-B of FIG. 2A.

A description will be given of a case where a parasitic inductance is not negligible when each ground of two transmission lines is coupled to each other, with reference to a micro strip line shown in FIG. 2A through FIG. 2C as a comparative embodiment. FIG. 2A illustrates a top view of the micro strip line. FIG. 2B illustrates a cross sectional view taken along a line A-A of FIG. 2A. FIG. 2C illustrates a cross sectional view taken along a line B-B of FIG. 2A. In the comparative embodiment, the first micro strip line 10 is formed in a MMIC chip 60 formed on a semi-insulating GaAs substrate 55. The GaAs substrate 55 has a thickness of few hundreds μm. The first ground layer 16 composed of such as a gold film is provided on the GaAs substrate 55. The first dielectric layer 14 composed of such as polyimide resin is provided on the first ground layer 16. The first signal line 12 composed of such as a gold film is provided on the first dielectric layer 14. On the other hand, the second micro strip line 20 is a print substrate composed of the second dielectric layer 24. The second ground layer 26 composed of such as a gold film is provided on a back face of the second dielectric layer 24. The second signal line 22 is provided on a front face of the second dielectric layer 24.

It is difficult to couple the first ground layer 16 and the second ground layer 26 at a short distance, in a case where the first ground layer 16 is provided on an insulating substrate or a semi-insulating substrate such as the GaAs substrate 55. As shown in FIG. 2B, a first coupling metal 41 on the first dielectric layer 14 is coupled to the first ground layer 16 through a coupling portion 44 passing through the first dielectric layer 14. Similarly, a second coupling metal 42 on the second dielectric layer 24 is coupled to the second ground layer 26 through a coupling portion 45 passing through the second dielectric layer 24. The first coupling metal 41 and the second coupling metal 42 are coupled to each other through a wire 43 composed of gold or the like. Thus, the first ground layer 16 and the second ground layer 26 are coupled to each other. However, a distance between the first ground layer 16 and the second ground layer 26 is approximately 1 mm because the GaAs substrate 55 and a print substrate has a thickness of few hundreds μm. The parasitic impedance of a ground-coupling portion 40 is not negligible, when a transmission signal is a high frequency wave such as a milliwave. And so, an embodiment solves the problem mentioned above.

First Embodiment

Figure 3A:
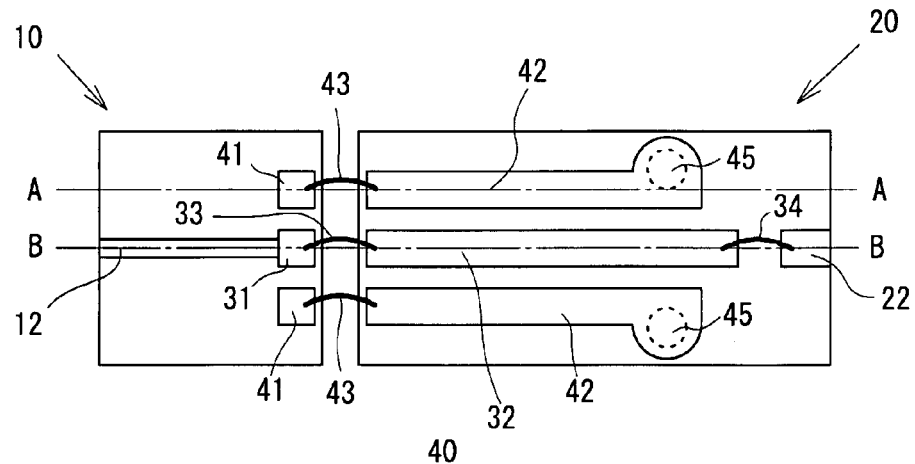
FIG. 3A illustrates a top view of a first embodiment.
Figure 3B:
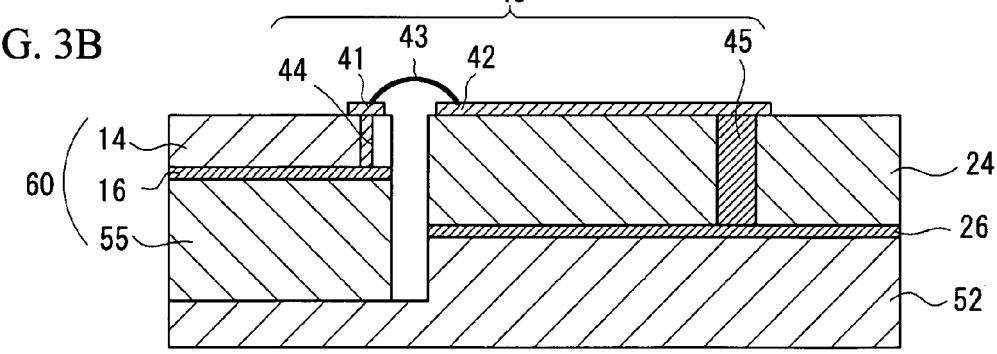
FIG. 3B illustrates a cross sectional view taken along a line A-A of FIG. 3A.
Figure 3C:
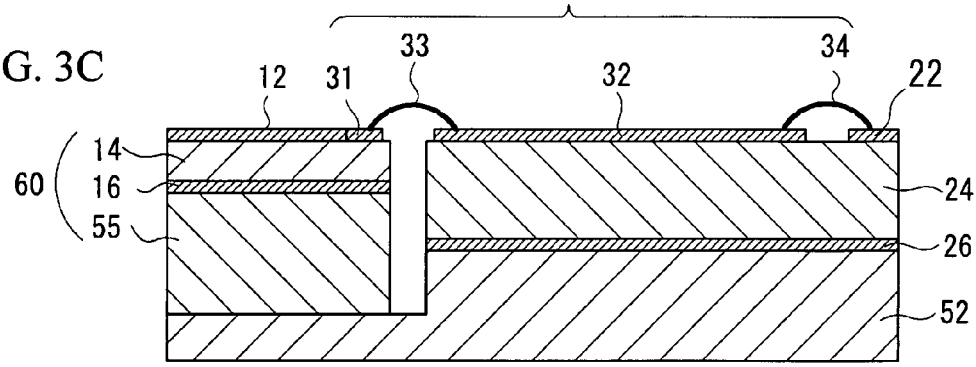
FIG. 3C illustrates a cross sectional view taken along a line B-B of FIG. 3A.

FIG. 3A illustrates a top view of an electronic device in accordance with a first embodiment. FIG. 3B illustrates a cross sectional view taken along a line A-A of FIG. 3A. FIG. 3C illustrates a cross sectional view taken along a line B-B of FIG. 3A. In the first embodiment, the first ground layer 16 and the second ground layer 26 are coupled to each other through the ground-coupling portion 40. The first signal line 12 and the second signal line 22 are coupled to each other through a signal-coupling portion 30.

The ground-coupling portion 40 is composed of the first coupling metal 41, the second coupling metal 42 and the wire 43. The first coupling metal 41 is coupled to the first ground layer 16 through the coupling portion 44 and is provided on the first dielectric layer 14. The second coupling metal 42 is coupled to the second ground layer 26 through the coupling portion 45 and is provided on the second dielectric layer 24. The wire 43 couples the first coupling metal 41 and the second coupling metal 42. The signal-coupling portion 30 is composed of a third signal line 32, a first wire 33 and a second wire 34. The third signal line 32 is provided on the second dielectric layer 24. The first wire 33 couples the first signal line 12 and the third signal line 32. The second wire 34 couples the second signal line 22 and the third signal line 32.

Figure 4:
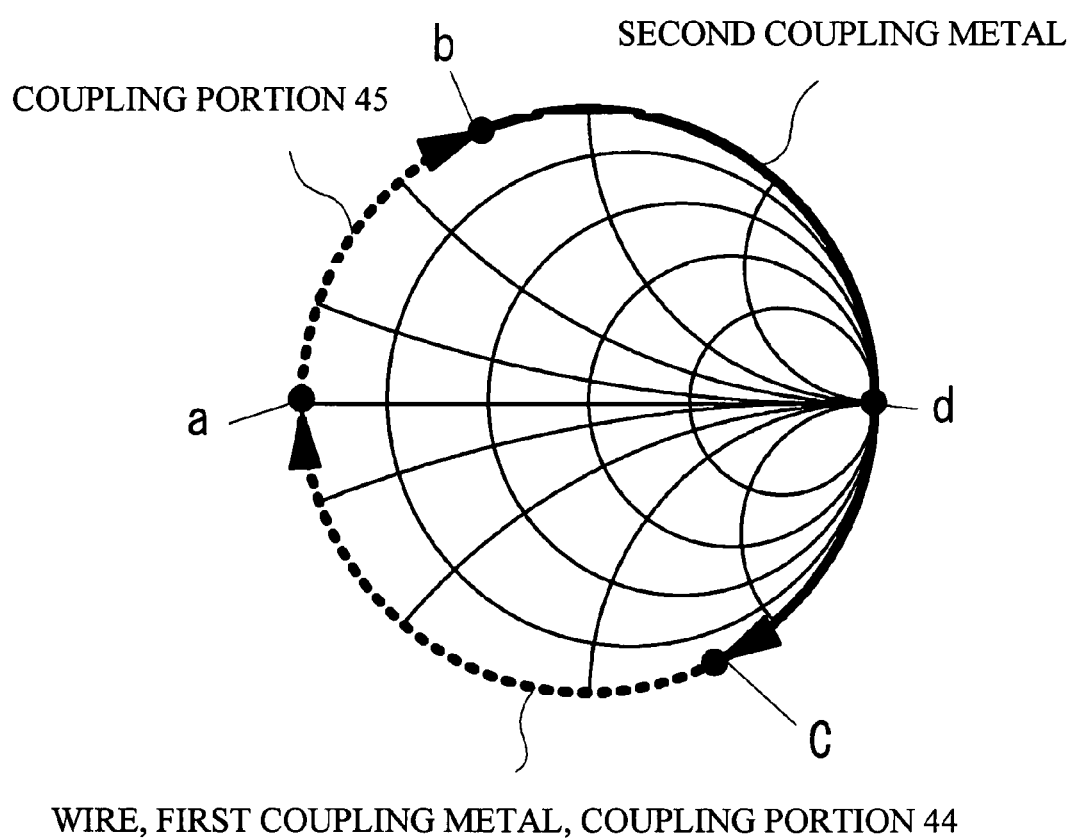
FIG. 4 illustrates a Smith chart showing an impedance locus of a ground-coupling portion.

FIG. 4 illustrates a Smith chart showing an impedance locus of the ground-coupling portion 40 at a frequency of a signal to be used. Impedance at the metal substrate 50 or the second ground layer 26 is "a", and resistance and reactance are zero. Impedance with reference to the first ground layer 16 is "b" because of the inductance of the coupling portion 45, and is "c" because of the inductance of the second coupling metal 42. At last, the impedance gets to "a", zero, again because of the inductance of the first coupling metal 41 and the coupling portion 44. That is, the ground-coupling portion 40 is provided so that a phase difference between high frequency waves at both ends of the ground-coupling portion 40 at a frequency of signal to be used is substantially integral multiple of 180 degrees (that is, an electrical length is half of a wavelength). Thus, the impedance between the first ground layer 16 and the second ground layer 26 is approximately zero. The electrical potential of the first ground layer 16 is approximately equal to that of the second ground layer 26.

In accordance with the first embodiment, as shown in FIG. 4, the ground-coupling portion 40 is designed so that a phase difference between high frequency waves at both ends of the ground-coupling portion 40 is substantially integral multiple of 180 degrees (that is, an electrical length is half of a wavelength), the ground-coupling portion 40 coupling the first micro strip line 10 (a first transmission line) and the second micro strip line 20 (a second transmission line), the first micro strip line 10 being composed of the first signal line 12 transmitting a given high frequency wave signal and the first ground layer 16 (a first ground), the second micro strip line 20 (a second transmission line) being composed of the second signal line 22 and the second ground layer 26 (a second ground). A length of the second coupling metal 42 is adjusted and the phase difference is designed. It is therefore possible to equalize electrical potentials of the first ground layer 16 and the second ground layer 26, and is possible to limit a loss between the two micro strip lines.

The electronic device in accordance with the first embodiment is effective because a parasitic inductance is easily added when the first ground layer 16 and the second ground layer 26 are coupled to each other, in a case where the first micro strip line 10 (or the second micro strip line 20) is composed of the first ground layer 16 and the first signal line 12 provided on the GaAs substrate 55 (a semiconductor chip).

The ground-coupling portion 40 may go through the GaAs substrate 55 or the second dielectric layer 24 without going through the surface side. In this case, however, a process is difficult and controlling the length of the ground-coupling portion 40 is difficult. Therefore, it is preferable that the ground-coupling portion 40 couples the first ground layer 16 and the second ground layer 26 through the surface of the first dielectric layer 14 at the first signal line 12 side or the surface of the second dielectric layer 24 at the second signal line 22 side. That is, it is preferable that the first signal line 12 and the second signal line 22 are provided on the first dielectric layer 14 and the second dielectric layer 24 and that at least a part of the ground-coupling portion 40 couples the first ground layer 16 and the second ground layer 26 through on the first dielectric layer 14 and the second dielectric layer 24. It is therefore easy to control the length of the ground-coupling portion 40 by controlling the length of the line at the surface side. And it is possible to control the phase difference between the both ends of the ground-coupling portion 40 to be substantially integral multiple of 180 degrees.

The impedance of the ground-coupling portion 40 is controlled mainly with the length of the second coupling metal 42 provided on the second dielectric layer 24. That is, the impedance of the ground-coupling portion 40 is controlled with the length of the second coupling metal 42. It is therefore possible to reduce a dispersion caused by manufacturing. And, the length of the first coupling metal 41 provided on the first dielectric layer 14 may be increased, although the impedance of the ground-coupling portion 40 is controlled to be a desirable value by extending the second coupling metal 42. And the number of the first coupling metal 41 may be one or more than three, although the number of the first coupling metal 41 is two.

In the first embodiment, the second coupling metal 42 may be a ground line of a coplanar line including the third signal line 32 as a signal line. And the second coupling metal 42 may be a ground line of a coplanar line including the second signal line as a signal line. Further, the first coupling metal 41 may be a ground line of a coplanar line in a case where the length of the first coupling metal 41 is large.

Figure 5:
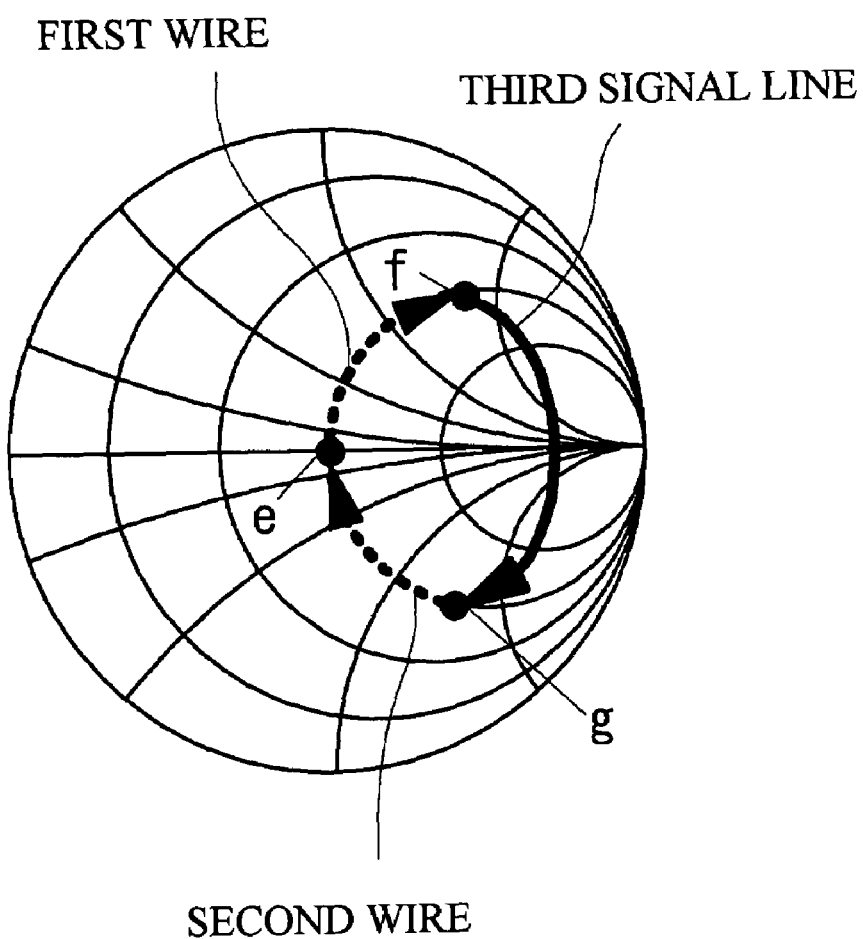
FIG. 5 illustrates a Smith chart showing an impedance locus of a first signal line with reference to a signal-coupling portion.

FIG. 5 illustrates a Smith chart showing an impedance locus when the first signal line 12 is noted. A characteristic impedance of the first micro strip line 10 and the second micro strip line 20 is 50Ω. The Smith chart is characterized with reference to 50Ω. And a center of the Smith chart is 50Ω. The impedance of the first signal line 12 is "e". The impedance of the first signal line 12 with reference to the first wire 33 moves by the inductance on a 50Ω constant resistance circle and gets to "f", because the resistance of the first wire 33 is approximately zero. Further, the characteristic impedance of the third signal line 32 is 50Ω. Therefore, the impedance of the first signal line 12 with reference to the third signal line 32 moves approximately on a circular arc centering on the center of the Smith chart based on the length of the third signal line 32. The length of the third signal line 32 is set so that the impedance is "g" of the circular arc of the 50Ω constant resistance circle. The impedance, in a case where the second wire 34 is added, moves on the 50Ω constant resistance circle by a distance as same as that of the first wire 33 and comes back to "e", when the reactance of the second wire 34 is substantially equal to that of the first wire 33. It is possible to set the impedance of the first signal line 12 with reference to the signal-coupling portion 30 to be 50Ω. Here, the first wire 33 and the second wire 34 are explained mainly with use of the parasitic inductance. However, it is possible to set the impedance of the first signal line 12 with reference to the signal-coupling portion 30 to be 50Ω with use of the first wire 33 and the second wire 34 even if the parasitic inductance is added.

As shown in FIG. 5, it is possible to limit a loss between the two micro strip lines, when the impedance of the signal-coupling portion 30 is set so that the characteristic impedance of the first micro strip line 10 matches with that of the second micro strip line 20.

And the signal-coupling portion 30 is composed of the third signal line 32, the first wire 33 and the second wire 34. In particular, it is possible to reduce dispersion at a manufacturing process, because it is possible to match the impedances with each other when the reactance of the first wire 33 is approximately equal to that of the second wire 34 and the length of the third signal line 32 is controlled.

Figure 6A:
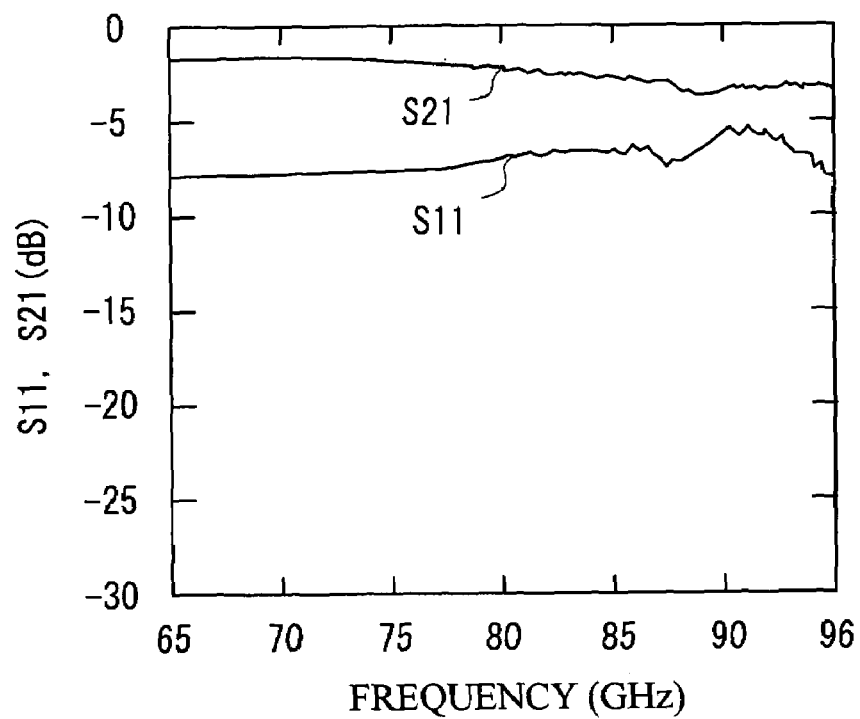
FIG. 6A and FIG. 6B illustrate S11 and S21 of a comparative embodiment and a first embodiment respectively.
Figure 6B:
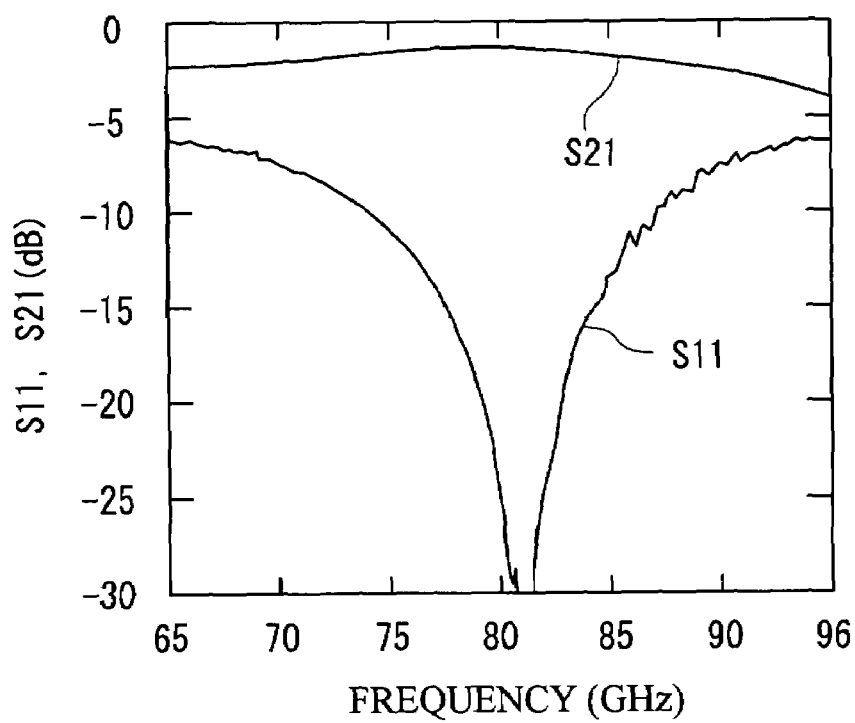

FIG. 6A and FIG. 6B illustrate a result when S11 and S21 of the second micro strip line 20 and the first micro strip line 10 are measured in the comparative embodiment and the first embodiment respectively. As shown in FIG. 6A, in the comparative embodiment, S11 is approximately −8 dB regardless of frequency of a signal, and reflection loss is large. And S21 is −3 dB, and insertion loss is large. As shown in FIG. 6B, in the first embodiment, S11 is less than −30 dB at 81 GHz, and reflection loss is very small. And S21 is approximately −1 dB at 81 GHz, and insertion loss is small. In accordance with the first embodiment, it is possible to reduce the reflection loss and the insertion loss at a frequency of a high frequency wave when the ground-coupling portion 40 and the signal-coupling portion 30 are provided.

When the phase difference between signals of the ground-coupling portion 40 is substantially 180 degrees, S11 is improved with respect to FIG. 6A, as shown in FIG. 6B. It is preferable that S11 is less than −15 dB in FIG. 6B. Therefore, it is preferable that the frequency in FIG. 6B is 81 GHz plus or minus 4 GHz. And it is preferable that the phase difference of the signals is 180 degrees plus or minus 5%.

Second Embodiment

Figure 7A:
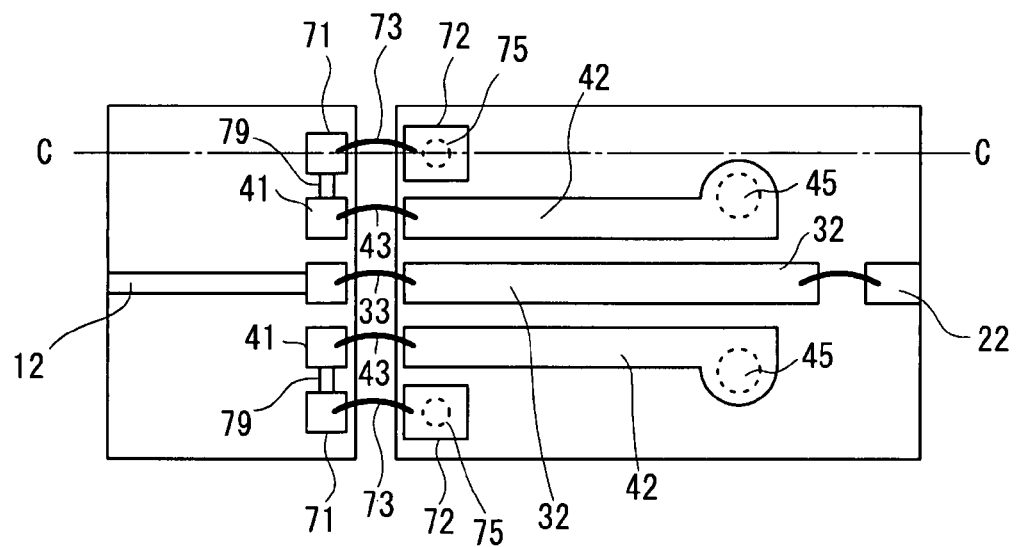
FIG. 7A illustrates a top view of a second embodiment.
Figure 7B:
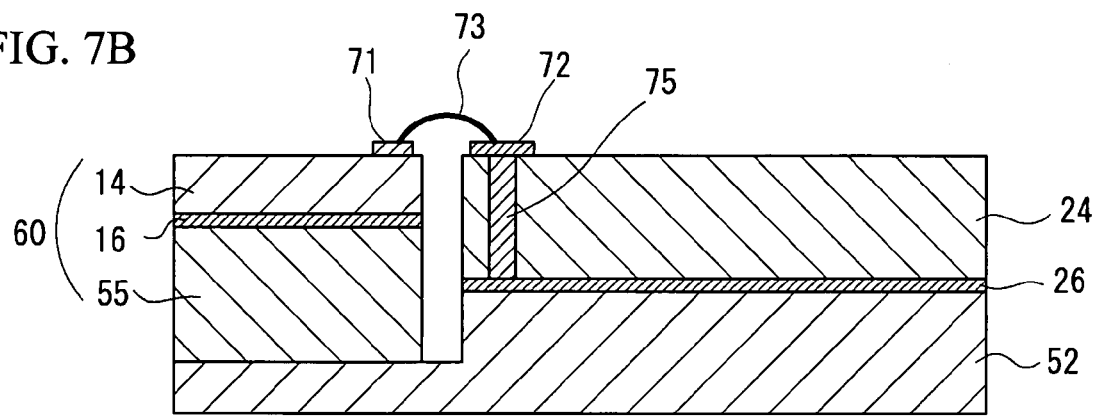
FIG. 7B illustrates a cross sectional view taken along a line C-C of FIG. 7A.

FIG. 7A illustrates a top view of an electronic device in accordance with a second embodiment. FIG. 7B illustrates a cross sectional view taken along a line C-C of FIG. 7A. In the second embodiment, a third coupling metal 71 is provided on the first dielectric layer 14 and is coupled to the first coupling metal 41 through a resistor 79, being different from the first embodiment. A fourth coupling metal 72 is provided on the second dielectric layer 24 and is coupled to the second ground layer 26 through a coupling portion 75. The third coupling metal 71 and the fourth coupling metal 72 are coupled to each other through a third wire 73. The first ground layer 16 and the second ground layer 26 are coupled to each other through a resistor in parallel with the ground-coupling portion 40.

In the first embodiment, the ground-coupling portion 40 opens at a frequency where the impedance of the ground-coupling portion 40 is "d" in FIG. 4. The impedance of the ground-coupling portion 40 is high at a given frequency. In accordance with the second embodiment, it is possible to prevent that the impedances of the first ground layer 16 and the second ground layer 26 are high even if the impedance of the ground-coupling portion 40 is high, because the first ground layer 16 and the second ground layer 26 are coupled to each other in parallel with the ground-coupling portion 40. The resistor 79 is a dumping resistor for preventing a resonance.

Third Embodiment

Figure 8:
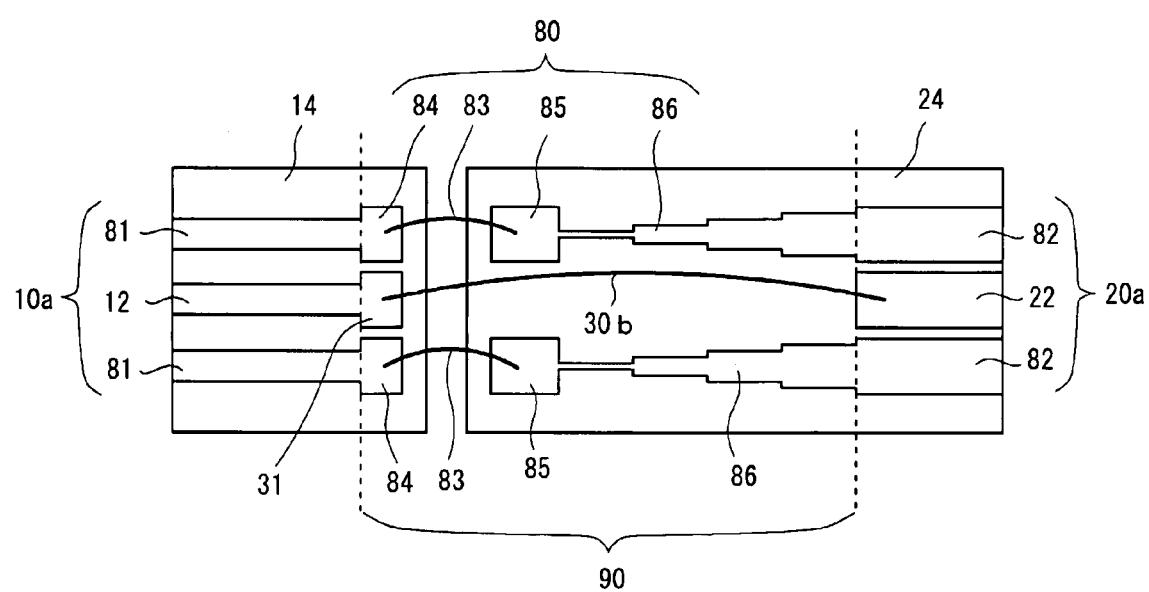
FIG. 8 illustrates a top view of a third embodiment.

In a third embodiment, two coplanar lines are coupled to each other, as the two transmission lines. As shown in FIG. 8, a first coplanar line 10a (a first transmission line) provided on a GaAs substrate and a second coplanar line 20a (a second transmission line) provided on a print substrate are coupled to each other. The first ground layer 16 is not provided on the back face of the GaAs substrate and the second ground layer 26 is not provided on the back face of the print substrate, being different from the first embodiment shown in FIG. 3B and FIG. 3C. A first ground line 81 (a first ground) is provided on both sides of the first signal line 12 on the first dielectric layer 14. The first signal line 12 and the first ground line 81 compose the first coplanar line 10a. A second ground line 82 (a second ground line) is provided on both sides of the second signal line 22 on the second dielectric layer 24. The second signal line 22 and the second ground line 82 compose the second coplanar line 20a.

The first coplanar line 10a and the second coplanar line 20a are coupled to each other in a coupling area 90. In the coupling area 90, a pad 31 and the second signal line 22 are coupled to each other through a wire 30b. The first ground line 81 and the second ground line 82 are coupled to each other through a ground-coupling portion 80. The ground-coupling portion 40 is composed of a fifth coupling metal 86, pads 84 and 85, and a wire 83. The second ground line 82 and the pad 85 are coupled to each other through the fifth coupling metal 86 on the second dielectric layer 24. A width of the fifth coupling metal 86 is reduced at the pad 85 side in order to limit a reflection at the second ground line 82. The pad 84 coupled to the first ground line 81 and the pad 85 are coupled to each other through the wire 83. And a phase difference between signals at both ends of the ground-coupling portion 80 is substantially integral multiple of 180 degrees, mainly when the length of the fifth coupling metal 86 is adjusted. It is therefore possible to limit a loss, similarly to the first embodiment. And it is easy to control the length of the fifth coupling metal 86, because the fifth coupling metal 86 is provided on the second dielectric layer 24. The fifth coupling metal 86 may be provided between the pad 84 and the first ground line 81 on the first dielectric layer 14.

The transmission line is not limited to the two micro strip lines in accordance with the first embodiment and the second embodiment and the two coplanar lines in accordance with the third embodiment. One of the two transmission lines may be a micro strip line or a coplanar line. One or both of the two transmission lines may be a transmission line except for the micro strip line and the coplanar line.

The first transmission lines on the GaAs substrate and the second transmission line on the print substrate are described in the first embodiment through the third embodiment. The present invention can be applied to a coupling between MMICs, a coupling between print substrates or a coupling between other transmission lines.

In the embodiments mentioned above, a frequency at approximately 80 GHz is noted as an example. The frequency is not limited to 80 GHz. However, the length of a line for shifting a phase by 180 degrees is enlarged when the frequency is low. Therefore, it is preferable that the present invention is applied to an electronic device using a signal at a frequency more than that of a milliwave. And it is more preferable that the present invention is applied to an electronic device using a signal at more than 60 GHz.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-152894 filed on May 31, 2006, the entire disclosure of which is hereby incorporated by reference.

What is claimed is:

1. An electronic device comprising:
    a first transmission line composed of a first signal line transmitting a given high frequency wave signal and a first ground, the first transmission line being a micro strip line having a first dielectric layer between the first signal line and the first ground, the first ground being provided on a semiconductor chip, the first signal line being provided on the first dielectric layer and above the semiconductor chip;
    a second transmission line composed of a second signal line transmitting the high frequency wave signal and a second ground, the second transmission line being a micro strip line having a second dielectric layer between the second signal line and the second ground, the second signal line being provided on the second dielectric layer; and
    a ground-coupling portion coupling the first ground and the second ground,
    at least a part of the ground-coupling portion going through on at least one of the first dielectric layer and second dielectric layer,
    a phase difference between the high frequency wave signals at both ends of the ground-coupling portion being substantially integral multiple of 180 degrees.

2. The electronic device as claimed in claim 1, wherein the phase difference is 180 degrees plus or minus 5 degrees.

3. The electronic device as claimed in claim 1, wherein the first signal line and the second signal line are coupled to each other through a signal-coupling portion having a third signal line, a first wire and a second wire,
    the first wire coupling the first signal line and the third signal line,
    the second wire coupling the second signal line and the third signal line.

4. The electronic device as claimed in claim 3, wherein impedance of the signal-coupling portion is defined so that a characteristic impedance of the first transmission line matches with a characteristic impedance of the second transmission line.

5. An electronic device comprising:
    a first transmission line composed of a first signal line transmitting a given high frequency wave signal and a first ground;
    a second transmission line composed of a second signal line transmitting the high frequency wave signal and a second ground; and
    a ground-coupling portion coupling the first ground and the second ground,
    a phase difference between the high frequency wave signals at both ends of the ground-coupling portion being substantially integral multiple of 180 degrees,
    wherein the first ground and the second ground are coupled to each other through a resistor in parallel with the ground-coupling portion.

* * * * *